United States Patent
Fang et al.

(10) Patent No.: US 8,467,245 B2
(45) Date of Patent: Jun. 18, 2013

(54) NON-VOLATILE MEMORY DEVICE WITH PROGRAM CURRENT CLAMP AND RELATED METHOD

(75) Inventors: Shang-Wei Fang, Yilan County (TW); Ying-Je Chen, Taichung (TW); Hong-Yi Liao, Hsinchu (TW); Wein-Town Sun, Taoyuan County (TW); Yu-Hsiung Tsai, Hsinchu (TW); Cheng-Jye Liu, Hsinchu County (TW)

(73) Assignee: eMemory Technology Inc., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/315,299

(22) Filed: Dec. 9, 2011

(65) Prior Publication Data

US 2012/0087192 A1    Apr. 12, 2012

Related U.S. Application Data

(63) Continuation-in-part of application No. 12/944,711, filed on Nov. 11, 2010, now Pat. No. 8,369,154.

(60) Provisional application No. 61/451,605, filed on Mar. 11, 2011, provisional application No. 61/316,843, filed on Mar. 24, 2010.

(51) Int. Cl.
*G11C 11/34* (2006.01)
*G11C 16/04* (2006.01)

(52) U.S. Cl.
USPC .................................................. 365/185.15

(58) Field of Classification Search
USPC .................. 365/185.19, 104, 185.18, 185.26, 365/185.22
See application file for complete search history.

(56) References Cited

U.S. PATENT DOCUMENTS

| 4,357,685 | A | | 11/1982 | Daniele |
| 4,628,487 | A | * | 12/1986 | Smayling ................. 365/185.22 |
| 5,812,457 | A | | 9/1998 | Arase |
| 5,892,714 | A | | 4/1999 | Choi |
| 6,040,996 | A | | 3/2000 | Kong |
| 6,219,279 | B1 | | 4/2001 | Manolescu et al. |
| 6,621,742 | B1 | | 9/2003 | Yamada |

(Continued)

FOREIGN PATENT DOCUMENTS

| JP | H0621404 A | 1/1994 |
| JP | H07307097 A | 11/1995 |

(Continued)

OTHER PUBLICATIONS

Non-Volatille Memory White Paper "Non-Volatile Memory: The principles, the technologies, and their significance to the smart card integrated circuit" by David Sowards 1999, Emosyn and Silicon Storage Technology.*

*Primary Examiner* — Alexander Sofocleous
*Assistant Examiner* — Khamdan Alrobaie
(74) *Attorney, Agent, or Firm* — Winston Hsu; Scott Margo

(57) ABSTRACT

A method of programming a nonvolatile memory cell which comprises a select transistor and a memory transistor includes applying a preset limit current to a first input of the memory cell, applying a limit voltage to a current limiting circuit electrically connected to a second input of the memory cell, applying a limit voltage to stabilize a voltage drop of the memory cell, and applying a ramped gate voltage to the memory cell to program the memory cell with a preset limited current determined by the current limiting circuit.

11 Claims, 21 Drawing Sheets

U.S. PATENT DOCUMENTS

| | | |
|---|---|---|
| 7,154,783 B2 | 12/2006 | Lee |
| 7,251,163 B2 * | 7/2007 | O ........................ 365/185.18 |
| 7,474,563 B2 | 1/2009 | Hsu |
| 7,633,807 B2 | 12/2009 | Chen |
| 2001/0046174 A1 * | 11/2001 | Ma et al. ................ 365/230.08 |
| 2004/0156241 A1 | 8/2004 | Mokhlesi |
| 2008/0181013 A1 | 7/2008 | Chou |
| 2009/0219762 A1 * | 9/2009 | Mawatari ................ 365/185.23 |

FOREIGN PATENT DOCUMENTS

| | | |
|---|---|---|
| JP | H0877783 A | 3/1996 |
| JP | H098153 A | 1/1997 |
| JP | H0991980 A | 4/1997 |
| JP | H09181204 A | 7/1997 |
| JP | H09260518 A | 10/1997 |
| JP | H1083689 A | 3/1998 |
| JP | H11260080 A | 9/1999 |
| JP | 2000260193 A | 9/2000 |
| JP | 2000306390 A | 11/2000 |
| JP | 2001506063 A | 5/2001 |
| JP | 2002319293 A | 10/2002 |
| JP | 200463059 A | 2/2004 |
| JP | 2004281841 A | 10/2004 |
| JP | 2004281970 A | 10/2004 |
| JP | 2004281971 A | 10/2004 |
| JP | 2004327804 A | 11/2004 |
| JP | 2005533372 A | 11/2005 |
| JP | 2006173565 A | 6/2006 |
| JP | 2006518530 A | 8/2006 |
| JP | 2006313640 A | 11/2006 |
| JP | 2007142398 A | 6/2007 |
| JP | 200884523 A | 4/2008 |
| JP | 2008118040 A | 5/2008 |
| JP | 2009503763 A | 1/2009 |
| JP | 2009506472 A | 2/2009 |
| WO | 9919880 A1 | 4/1999 |
| WO | 02073623 A1 | 9/2002 |
| WO | 2004006340 A1 | 1/2004 |
| WO | 2004072981 A1 | 8/2004 |
| WO | 2007019010 A1 | 2/2007 |
| WO | 2007024565 A2 | 3/2007 |

* cited by examiner

NON-VOLATILE MEMORY DEVICE WITH PROGRAM CURRENT CLAMP AND RELATED METHOD

CROSS REFERENCE TO RELATED APPLICATIONS

This application claims the benefit of U.S. provisional application No. 61/451,605 (filed Mar. 11, 2011) entitled "Non-Volatile Memory Device Program Current Clamp Frame and Method Thereof," and is a continuation-in-part of U.S. patent application Ser. No. 12/944,711 (filed Nov. 11, 2010) entitled "Channel Hot Electron Injection Programming Method and Related Device," which claims the benefit of U.S. provisional application No. 61/316,843 (filed Mar. 24, 2010) entitled "P-channel Ramping CHEI Programming Method By Auto Tracing Vt Shift." The disclosures of the prior applications are incorporated by reference herein in their entirety.

BACKGROUND OF THE INVENTION

1. Field of the Invention

The present invention relates to non-volatile memory devices, and more particularly to a non-volatile memory device and related method that use a program current clamp.

2. Description of the Prior Art

Non-volatile memory is a type of memory that retains information even when no power is supplied to memory blocks thereof. Some examples include magnetic devices, optical discs, flash memory, and other semiconductor-based memory topologies. Some forms of non-volatile memory have bits defined in fabrication, some may be programmed only once (one time programmable ROM, OTP ROM), and other types may be programmed and reprogrammed many times over. As semiconductor memory technologies are scaled down, memory cell programming and reading times have decreased (making memory cells faster), require less current/power to operate, and have improved reliability. Further, program bias voltage decreases in advanced technology.

Memory cells are typically programmed through CHEI. CHEI occurs when channel carriers traveling from source to drain of a metal-oxide-semiconductor (MOS) transistor are heated due to drain-source voltage applied across the drain and the source. The hot electrons at the end of the channel have high energy, and are injected into a floating gate of the MOS transistor approximately in a direction perpendicular to the floating gate. However, a corner effect causes multiple issues when using CHEI to program, including longer programming time, wider array distribution, higher power consumption, and poor reliability due to hole damage. To compensate for the corner effect, circuit design becomes more complex and requires larger area.

Please refer to FIG. 1, which is a diagram illustrating a memory cell 10 comprising a memory transistor 100 and a select transistor 110 according to the prior art. As shown in FIG. 1, a control line voltage ZCL is connected to the gate of the memory transistor 100, and a bit line voltage BL is connected to the drain of the memory transistor 100. Moreover, a word line voltage ZWL is connected to the gate of the select transistor 110 and a source line voltage SL is connected to the source of the select transistor 110. The source line and the n well NW are at a common voltage level (VSL=VNW).

Please refer to FIG. 2 and FIG. 3, which are a diagram illustrating gate current versus gate voltage for a fixed control line voltage ZCL, and a diagram illustrating threshold voltage and CHEI current versus time for the fixed control line voltage, respectively. At an initial programming voltage Vt_ers corresponding to the memory transistor 100 being in an erased state, gate current obtained by applying the control line voltage ZCL is higher near the initial programming voltage Vt_ers, and lower the further away the control line voltage ZCL is from the initial programming voltage Vt_ers. However, during programming, threshold voltage Vt of the memory transistor 100 may shift. Thus, when the control line voltage ZCL applied during programming is fixed, a channel hot electron injection (CHEI) current profile obtained over time approximates that shown in FIG. 3 (convolution of the two areas shown in FIG. 2). As shown in FIG. 3, CHEI current is initially high and threshold voltage Vt of the memory transistor 100 increases rapidly. However, as the threshold voltage Vt increases, the CHEI current tapers off, and increase of the threshold voltage Vt slows down. This behavior leads to slow, inefficient programming of the memory transistor 100.

SUMMARY OF THE INVENTION

According to an embodiment, a method of programming a nonvolatile memory cell which comprises a select transistor and a memory transistor comprises applying a bias voltage to a first input of the memory cell, applying a preset limit current to a current limiting circuit electrically connected to a second input of the memory cell, and applying a ramped gate voltage to the memory cell to program the memory cell with a preset limited current determined by the current limiting circuit according to the limit voltage.

According to an embodiment, a nonvolatile memory device comprises a select transistor, a memory transistor, and a current limiting circuit. The select transistor has a first terminal, second terminal, and a gate terminal. The memory transistor has a third terminal coupled to the second terminal of the select transistor, a fourth terminal, and a control terminal. The control terminal of the memory transistor receives a ramped gate voltage for inducing a program current to program the memory transistor. The current limiting circuit controls bias across the first terminal of the select transistor and the fourth terminal of the memory transistor for limiting the program current.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
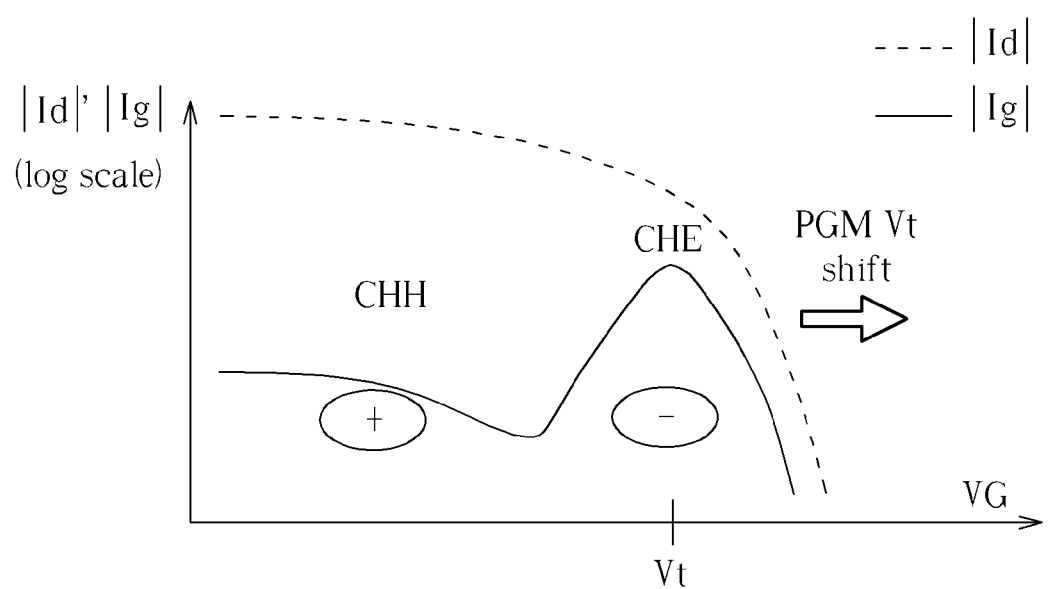
FIG. 4 is a diagram illustrating gate current and drain current as a function of gate voltage applied to a memory cell.

Please refer to FIG. 4, which illustrates gate current |Ig| and drain current |Id| as a function of gate voltage VG applied to a memory cell. The gate voltage VG may be a control line voltage applied through a control line to a control line input, such as a gate, of the memory transistor 100. Assuming the memory transistor 100 has an initial threshold voltage Vt, as gate voltage VG (signal ZCL) applied to a gate of the memory transistor 100 approaches the threshold voltage Vt, channel hot electron (CHE) injection occurs, and gate current |Ig| is maximized. Below the threshold voltage Vt, gate voltage VG results in lower gate current |Ig|, eventually leading to channel hot hole (CHH) injection, which may damage the memory transistor 100. Above the threshold voltage Vt, gate voltage VG results in diminishing gate current |Ig|, and drain current |Id| also drops off. As shown in FIG. 4, during programming, threshold voltage Vt increases as electrons are injected into a floating gate or ONO layer 102 of the memory transistor 100. Knowing this threshold voltage Vt shift phenomenon, by programming at a slightly increased gate voltage VG, e.g. 0.5 Volts over threshold voltage Vt, gate current |Ig| may be kept at a higher level for a greater proportion of the programming cycle, leading to faster programming time, and risk of dropping into CHH injection may also be reduced. Chip area may be reduced as conduction current is relatively low.

Figure 5:
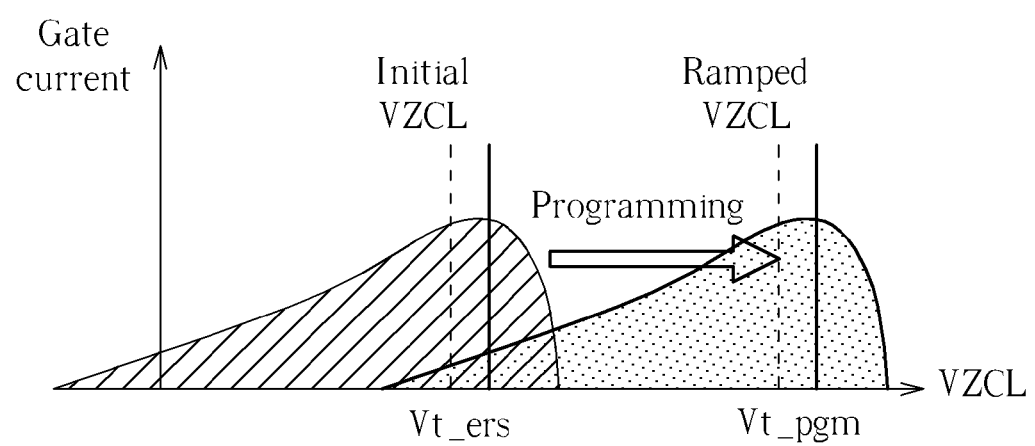
FIG. 5 is a diagram illustrating gate current versus gate voltage for a ramped control line voltage.
Figure 6:
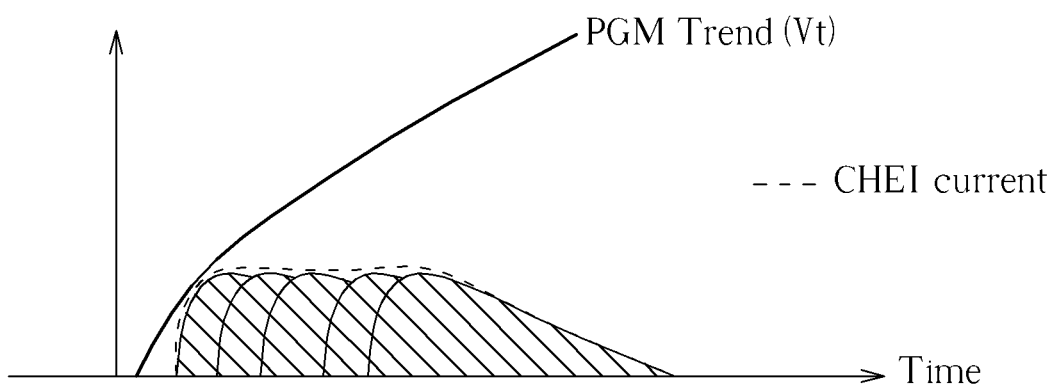
FIG. 6 is a diagram illustrating threshold voltage and CHEI current versus time for the ramped control line voltage.

Please refer to FIG. 5 and FIG. 6, which are diagrams illustrating gate current versus gate voltage (FIG. 5) and threshold voltage and CHEI current versus time (FIG. 6) for a ramped control line voltage programming method according to an embodiment. In a preferred mode, gate voltage VG applied to the memory transistor 100 during programming increases with threshold voltage shift. As shown in FIG. 5, initial gate voltage (left dashed line) is applied to maximize gate current (left hump peaks near initial gate voltage). As programming progresses, threshold voltage of the memory transistor 100 increases, such that initial gate voltage may be lower than erase voltage Vt_ers (left solid line). Simultaneously, threshold voltage of the memory transistor 100 is already at a higher voltage Vt_pgm. Thus, by ramping gate voltage applied to the memory transistor 100 with increasing threshold voltage (right hump peaks near Vt_pgm), the memory transistor 100 may be programmed by gate injection current at a predetermined level, e.g. roughly maximum gate current. Stepped ramping of gate voltage is shown conceptually in FIG. 6, where CHEI current is kept roughly maximum throughout programming, leading to rapid increase of threshold voltage Vt over time.

Figure 7:
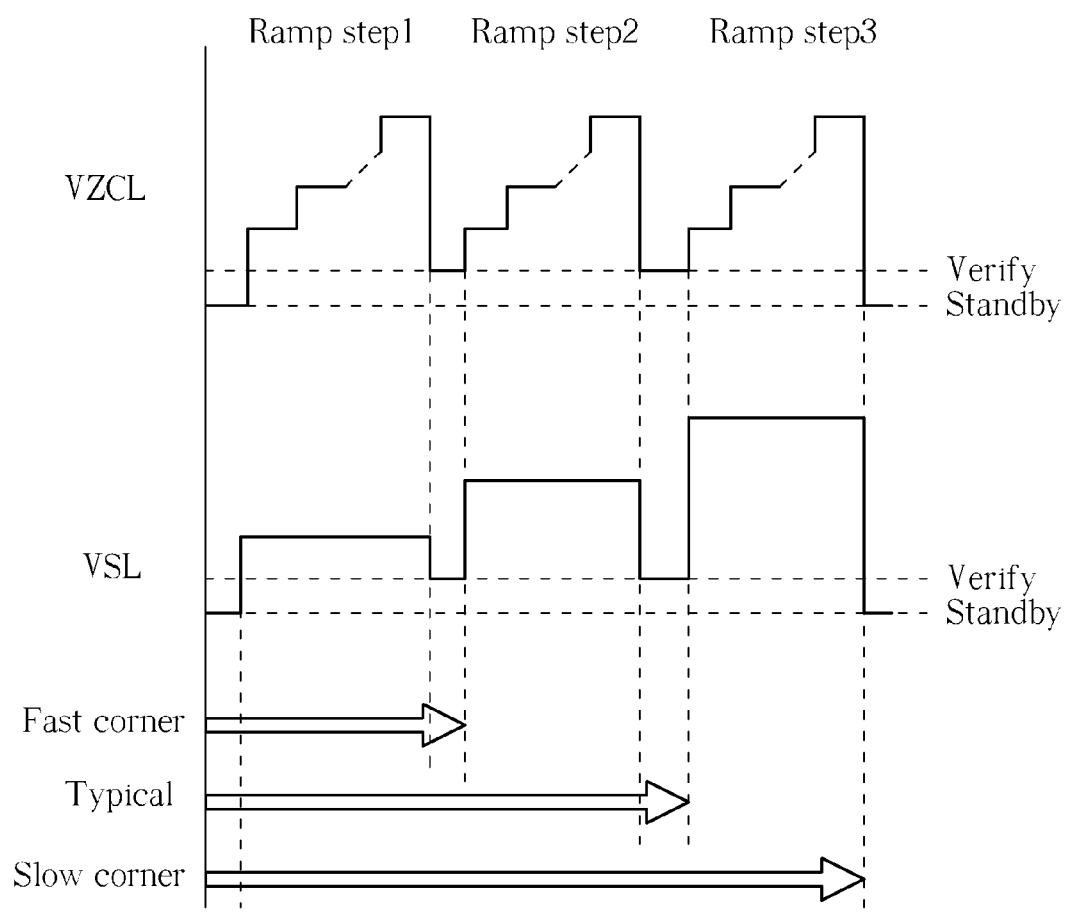
FIG. 7 is a timing diagram of control line signal and source line voltage signal according to an embodiment.

Please refer to FIG. 7, which is a timing diagram of control line signal (VZCL) and source line voltage signal VSL according to an embodiment. As shown in FIG. 7, control line signal VZCL applied to gate of the memory transistor 100 is ramped, and source line voltage signal VSL applied to source line 110 may also be ramped. Ramping the source line voltage signal VSL increases source line (SL) to bit line (BL) bias (BL voltage=0 volt), which also leads to better programming results. In the embodiment shown in FIG. 7, each increase in SL to BL bias corresponds to a ramp of control line signal VZCL. Number of steps in the ramp of control line signal VZCL is not limited herein, and is preferably at least one. Following each ramp of control line signal VZCL, a verification process is performed. Once verification is finished, if verification fails, further programming is required, so SL to BL bias is increased, and ramp of control line signal VZCL restarts. If verification passes, the control line signal VZCL and the source line voltage signal VSL may each enter a standby mode to stop programming. As shown in FIG. 7, three cycles may be employed to cover fast corner, typical, and slow corner memory cells. Fast corner memory cells pass verification after one programming ramp, typical memory cells pass verification after two programming ramps, and slow corner memory cells may pass verification after three programming ramps.

Figure 8:
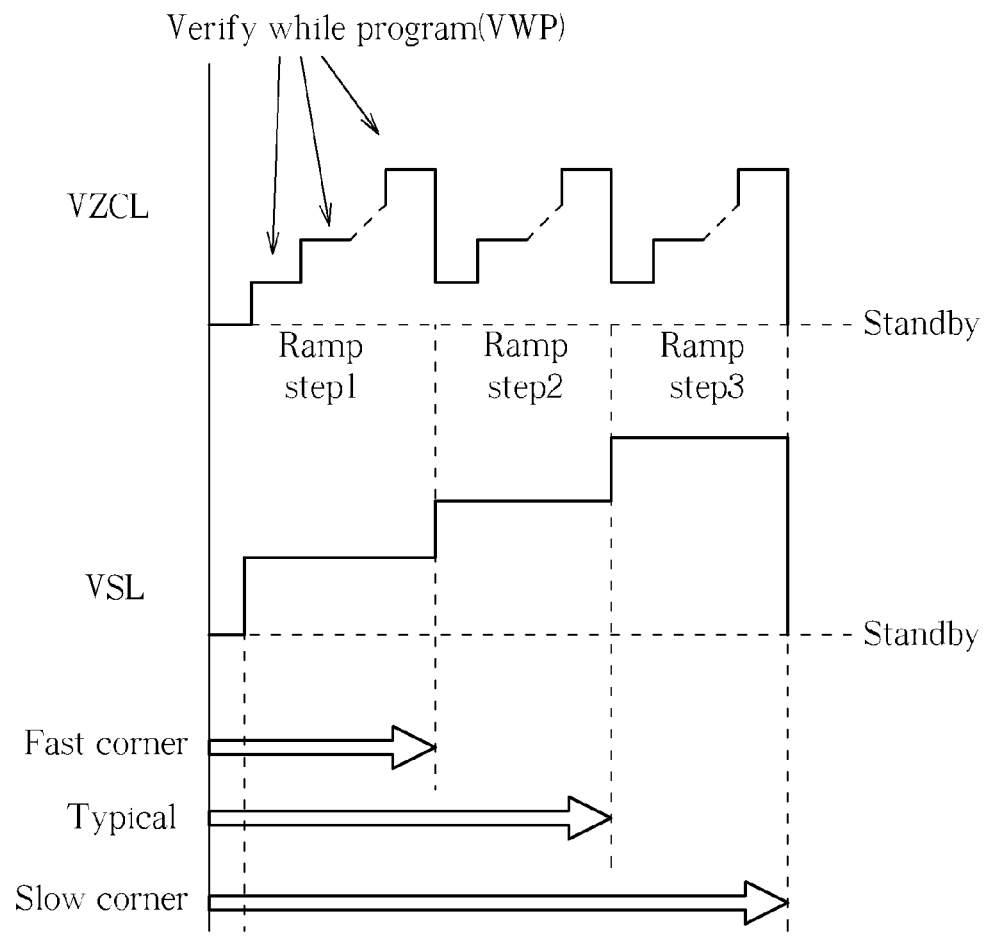
FIG. 8 is a timing diagram of control line signal and source line voltage signal according to another embodiment.

Please refer to FIG. 8, which is a timing diagram of control line signal (VZCL) and source line voltage signal VSL according to another embodiment. The timing diagram shown in FIG. 8 is similar to the diagram shown in FIG. 7, except that verification is performed during programming (Verify While Program, VWP). Thus, when one ramp of control line signal VZCL is finished, a new ramp of control line signal VZCL begins immediately thereafter, without a pause for verification.

Figure 9:
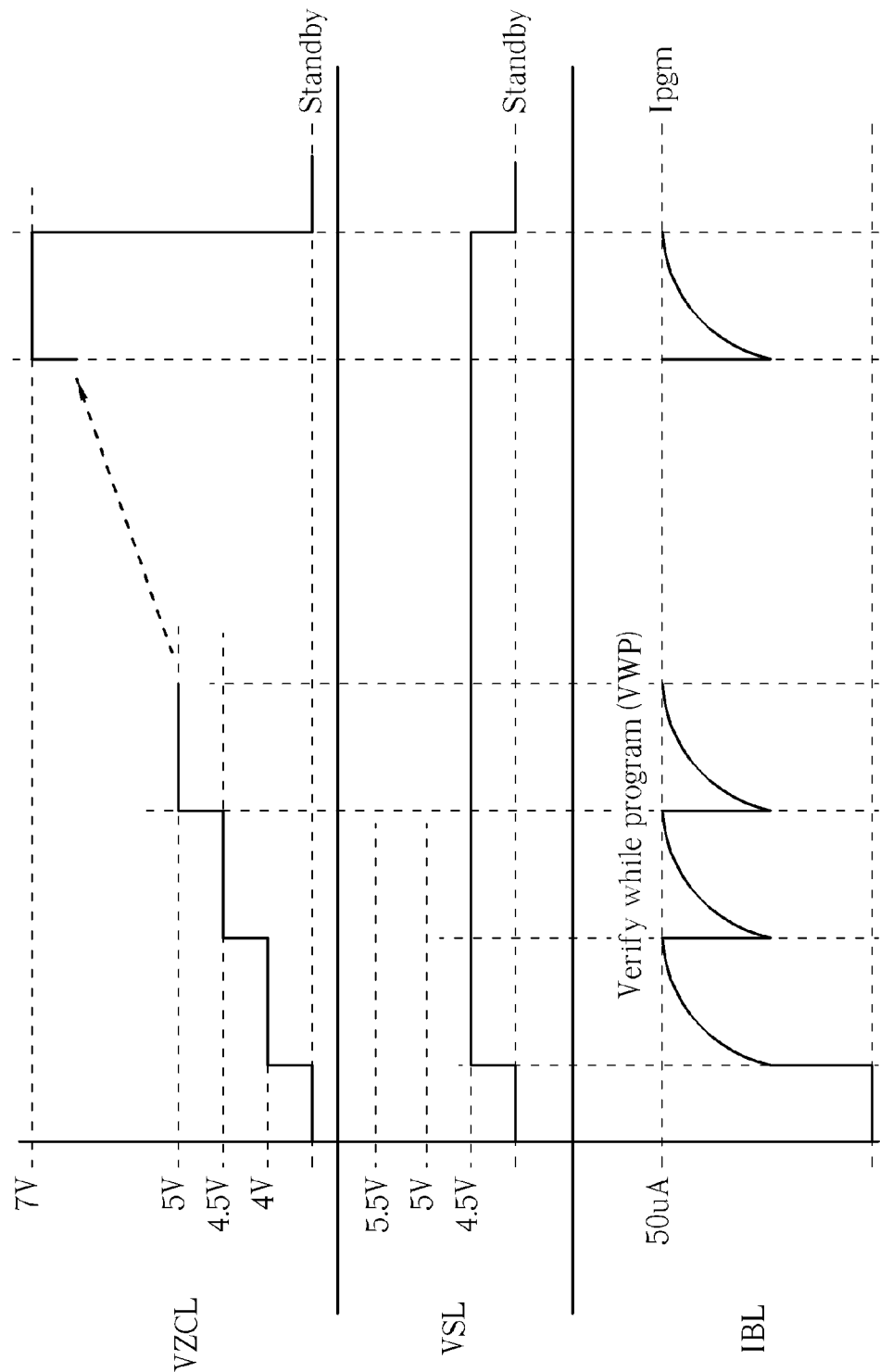
FIG. 9 is a timing diagram illustrating programming of a fast corner memory cell with verify-while-programming (VWP).
Figure 10:
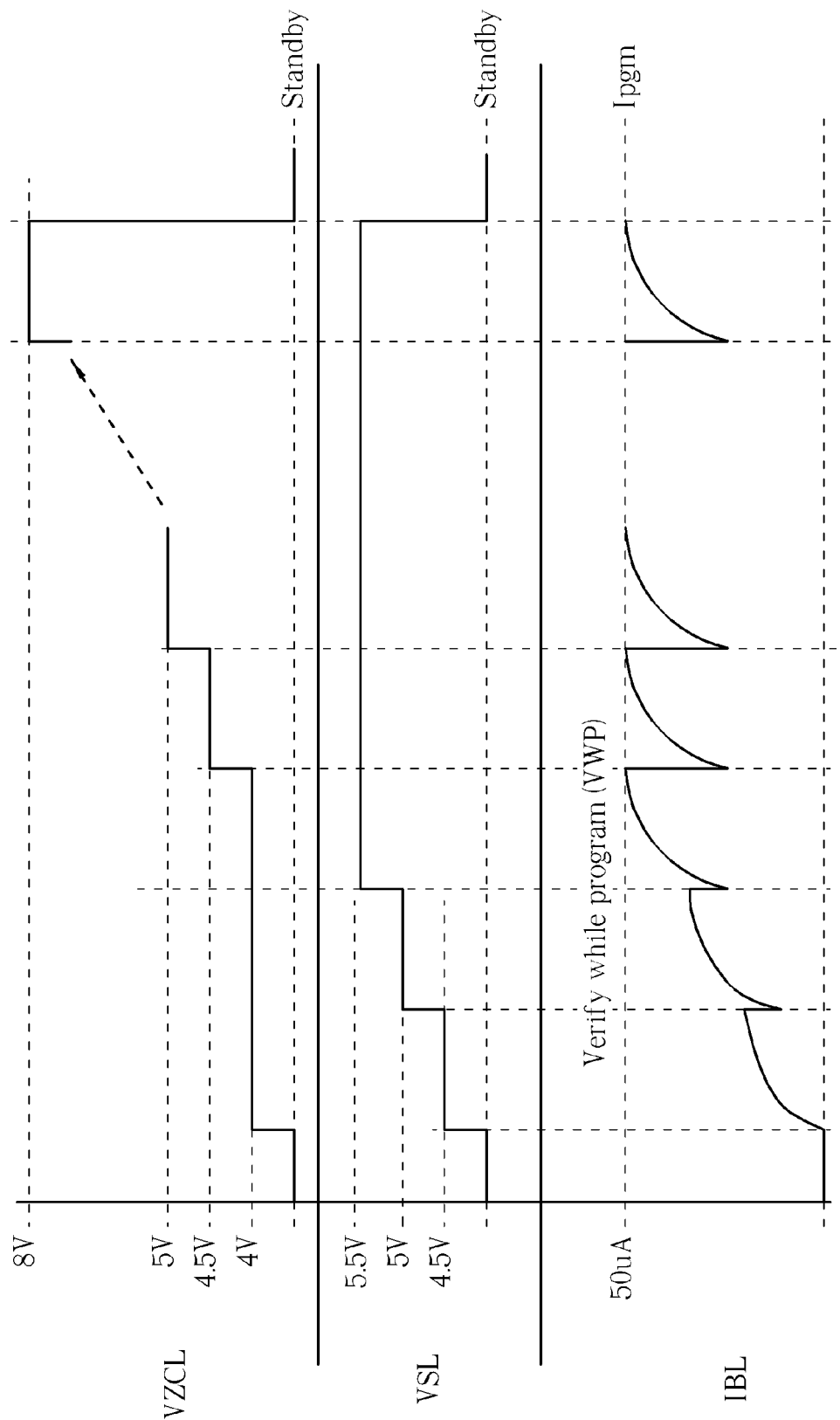
FIG. 10 is a timing diagram illustrating programming of a slow corner memory cell with VWP.

Please refer to FIG. 9 and FIG. 10. FIG. 9 is a timing diagram illustrating programming of a fast corner memory cell with VWP. FIG. 10 is a timing diagram illustrating programming of a slow corner memory cell with VWP. Voltages and times shown in FIG. 9 and FIG. 10 are provided as an example, but are not intended to limit the scope of the embodiment. To achieve high speed and low power consumption, control line signal VZCL is ramped. Start bias of control line signal VZCL may be close to initial threshold voltage Vt_start, and final bias may determine final programming threshold voltage Vt_final. To overcome device variation and disturb, SL to BL bias is ramped by ramping source line voltage signal VSL. For a fast corner memory cell (FIG. 9), one ramp of control line signal VZCL may be sufficient to complete programming, such that source line voltage signal VSL is kept constant throughout programming, and is not ramped. For a slow corner memory cell (FIG. 10), source line voltage signal VSL may be ramped until sufficiently high gate current is detected, e.g. 50 micro amps (μA), at which time control line signal VZCL may start to be ramped until programming is complete. As shown in FIG. 9 and FIG. 10, each step of ramping control line signal VZCL may begin upon reaching programming current Ipgm, e.g. 50 μA; each step of ramping SL to BL bias may begin upon reaching maximum programming time, e.g. 5 microseconds (us), without having reached programming current Ipgm. Please note that maximum programming time may be applied to both ramping source line voltage signal VSL and ramping control line signal VZCL. In another embodiment, maximum programming time may be applied to ramping source line voltage signal VSL, and a ramping programming time may be applied to ramping control line signal VZCL, where ramping programming time is shorter (faster) than maximum programming time.

Figure 11:
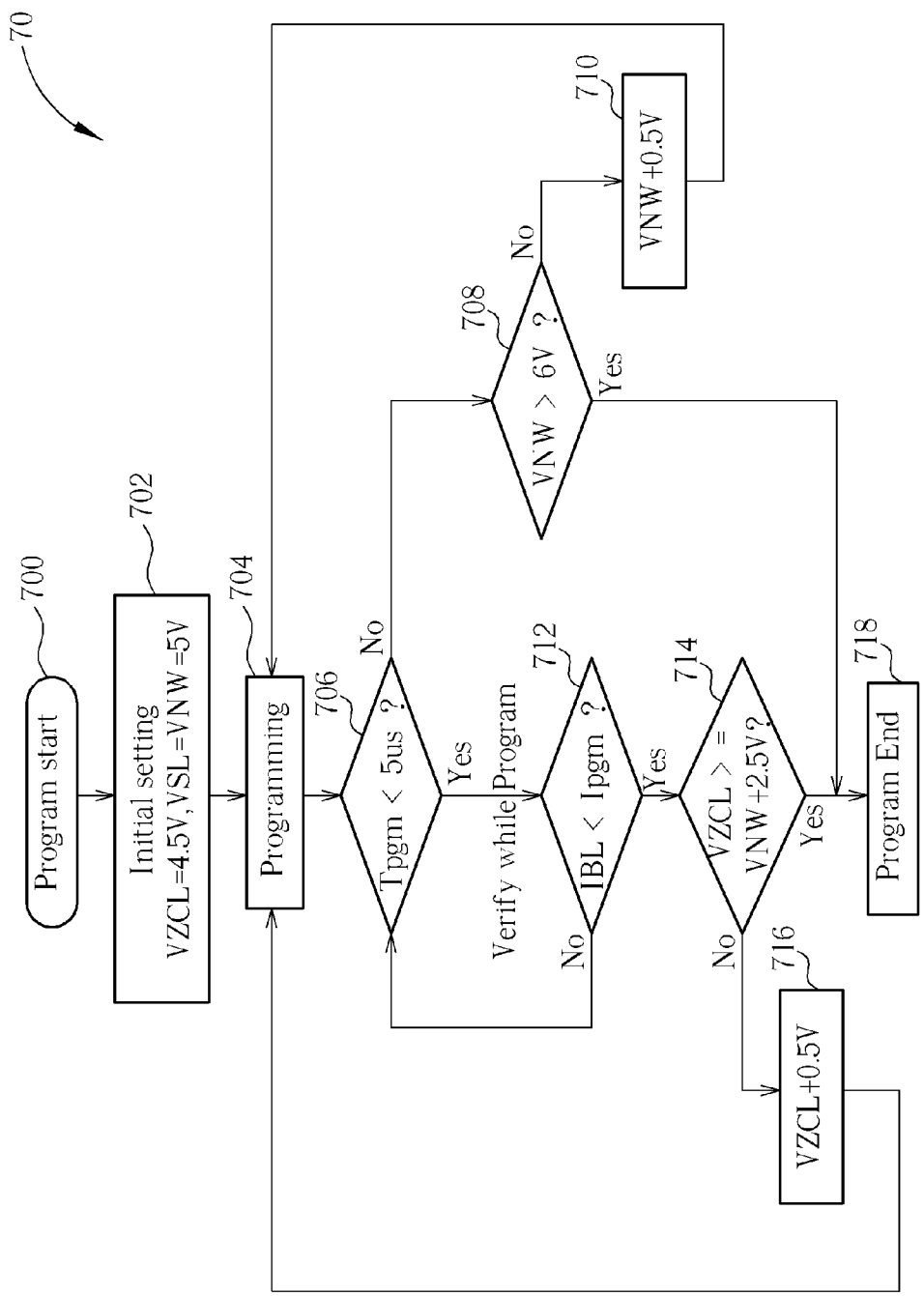
FIG. 11 is a flow chart of a process for performing channel hot electron injection programming with VWP according to an embodiment.

Please refer to FIG. 11, which is a flow chart of a process 70 for performing channel hot electron injection (CHEI) programming with VWP according to an embodiment. Programming starts (Step 700) when programming of a memory cell is required. Initial settings are applied to the memory transistor and corresponding select transistor, e.g. VZCL=4.5 Volts, VSL=VNW=5V, VBL=0 Volts, where VNW represents n-well voltage (Step 702). Programming is performed as described above (Step 704). If programming time Tpgm exceeds a predetermined period (Step 706), e.g. 5 us, and n-well voltage VNW is lower than a first voltage threshold (Step 708), e.g. 6V, n-well voltage is increased by a first step voltage (Step 710), e.g. 0.5V. If programming time Tpgm exceeds the predetermined period (Step 706), and n-well voltage VNW is higher than the first voltage threshold (Step 708), then programming ends (Step 718), possibly due to a memory cell that is too slow. If programming time Tpgm is less than the predetermined period (Step 706), and bit line current IBL is lower than predetermined programming current Ipgm (Step 712), e.g. 50 μA, the process 70 returns to Step 706. If bit line current IBL exceeds predetermined programming current Ipgm (Step 712) while programming time Tpgm is less than the predetermined period (Step 706), and control line signal VZCL is less than a gate voltage threshold (Step 714), e.g. VNW+2.5V, control line signal VZCL is increased by a second step voltage (Step 716), e.g. 0.5V. The first step voltage and the second step voltage may be the same or different. If the control line signal VZCL is greater than or equal to the gate threshold voltage, programming ends (Step 718). In the above, the first voltage threshold may be a predetermined control line voltage limit of the control line voltage applied to the control line of the memory transistor 100.

Figure 12:
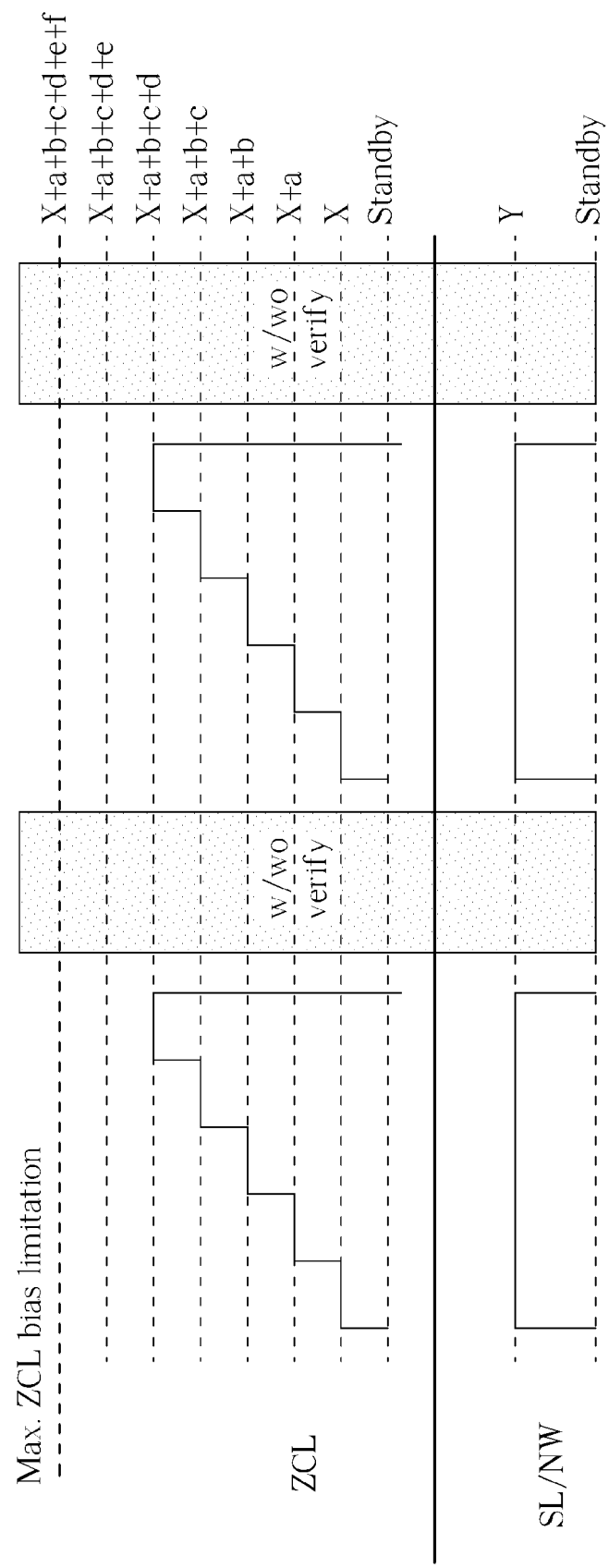
FIG. 12 is a diagram illustrating ramping of gate voltage according to an embodiment.

Please refer to FIG. 12, which is a diagram illustrating ramping of gate voltage ZCL according to an embodiment. Source line voltage SL, which may roughly equal n-well voltage NW, may be kept constant during programming at a voltage Y. Gate voltage ZCL may be set initially to a voltage X, which is higher than a standby voltage, during programming. A step voltage "a" may be added to the voltage X in a first step, a step voltage "b" may be added to the voltage X+a in a second step, and so forth until a step voltage X+a+b+c+d is reached. Verification may be performed, and a new ramp may begin from the voltage X. A maximum bias limitation may be set for gate voltage ZCL roughly equal to a voltage X+a+b+c+d+e+f. Voltage steps a, b, c, . . . , f may be the same or different. Number of voltage steps is also not limited herein.

Figure 13:
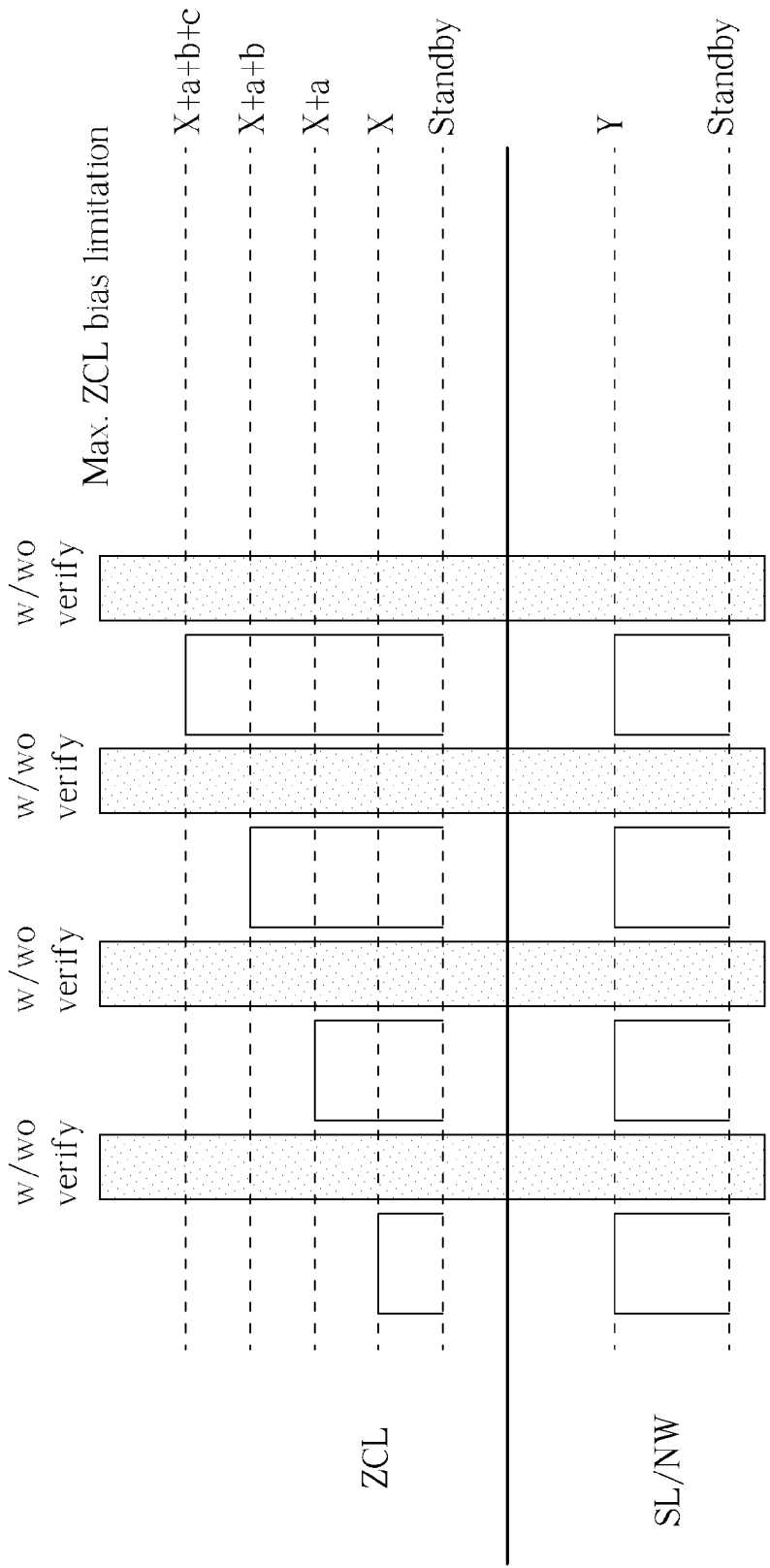
FIG. 13 is a diagram illustrating ramping of gate voltage according to another embodiment.

Please refer to FIG. 13, which is a diagram illustrating ramping of gate voltage ZCL according to another embodiment. Similar to FIG. 12, only gate voltage ZCL is ramped, and source line voltage SL is kept constant. However, unlike FIG. 12, in FIG. 13, verification may be performed after each step up in gate voltage ZCL. For example, after voltage X is applied, verification may be performed, then voltage X+a may be applied, verification may be performed, and so forth.

Figure 14:
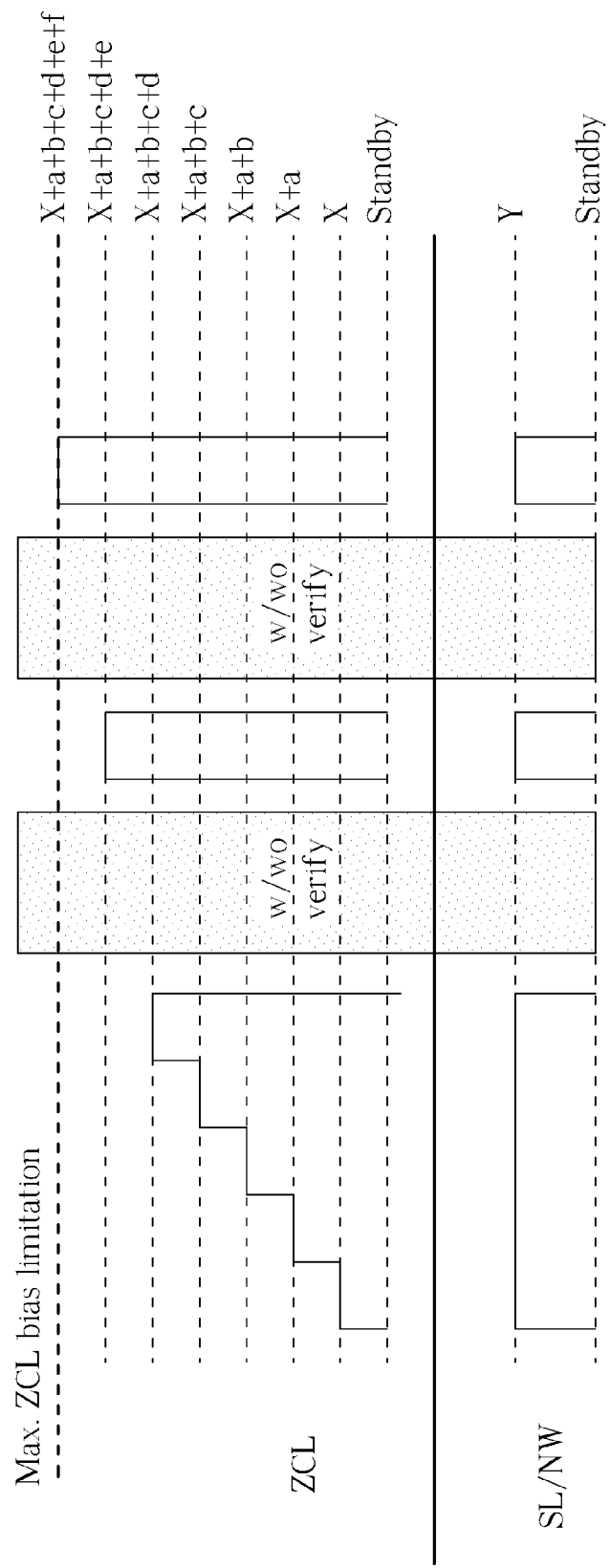
FIG. 14 is a diagram illustrating ramping of gate voltage according to another embodiment.

Please refer to FIG. 14, which is a diagram illustrating ramping of gate voltage ZCL according to another embodiment. FIG. 14 combines FIG. 12 and FIG. 13. Initially, ramping is performed on gate voltage ZCL uninterrupted, until voltage X+a+b+c+d is reached. Then, verification may be performed before stepping up to voltage X+a+b+c+d+e. Verification may be performed again, then gate voltage ZCL may be stepped up to voltage X+a+b+c+d+e+f. Order of the combination of FIG. 12 and FIG. 13 is not limited to that shown in FIG. 14. FIG. 14 illustrates the ramping of FIG. 12 preceding the ramping of FIG. 13, but the ramping of FIG. 13 may also precede the ramping of FIG. 12.

Figure 15:
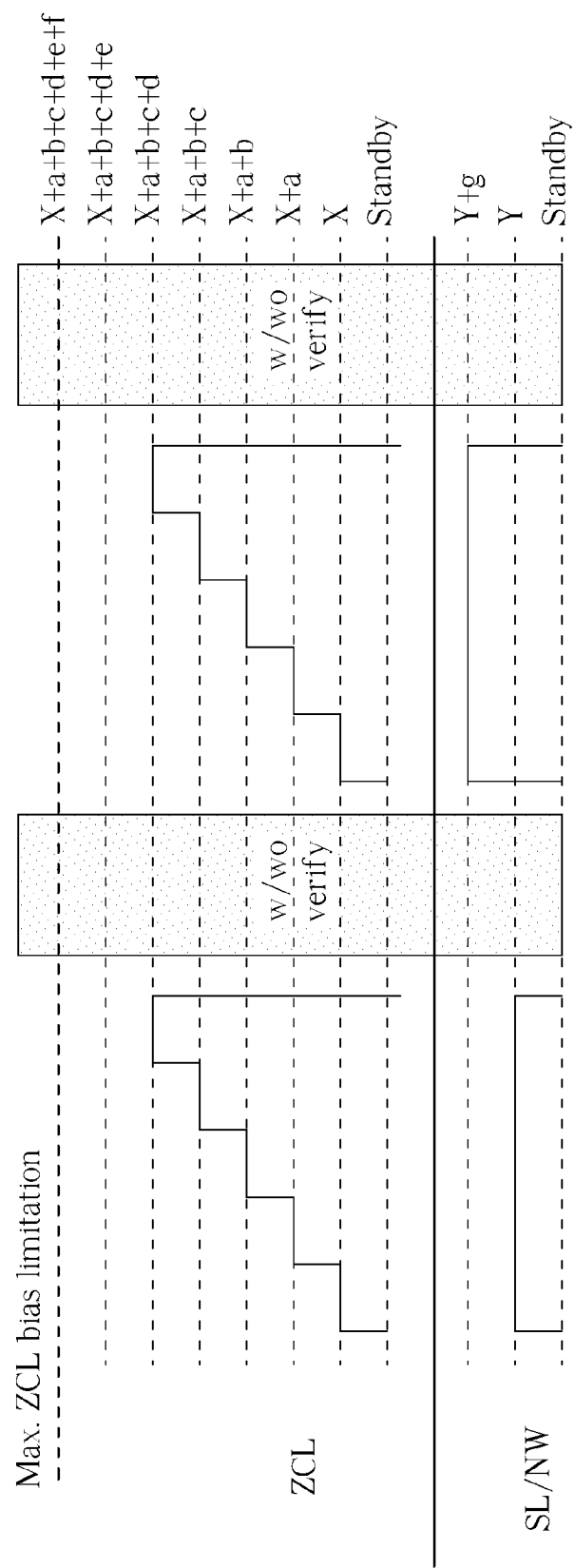
FIG. 15 is a diagram illustrating ramping gate voltage and source line/n-well voltages according to an embodiment.

Please refer to FIG. 15, which is a diagram illustrating ramping gate voltage ZCL and source line/n-well voltages SL/NW according to an embodiment. Gate voltage ZCL is stepped up from voltage X to voltage X+a+b+c+d, while source line/n-well voltages SL/NW are at voltage Y. Verification may be performed. Then, gate voltage ZCL is stepped up again starting from voltage X and increasing to voltage X+a+b+c+d, while source line/n-well voltages SL/NW are at voltage Y+g. Voltage "g" may be the same or different from voltages a, b, . . . , f.

Figure 16:
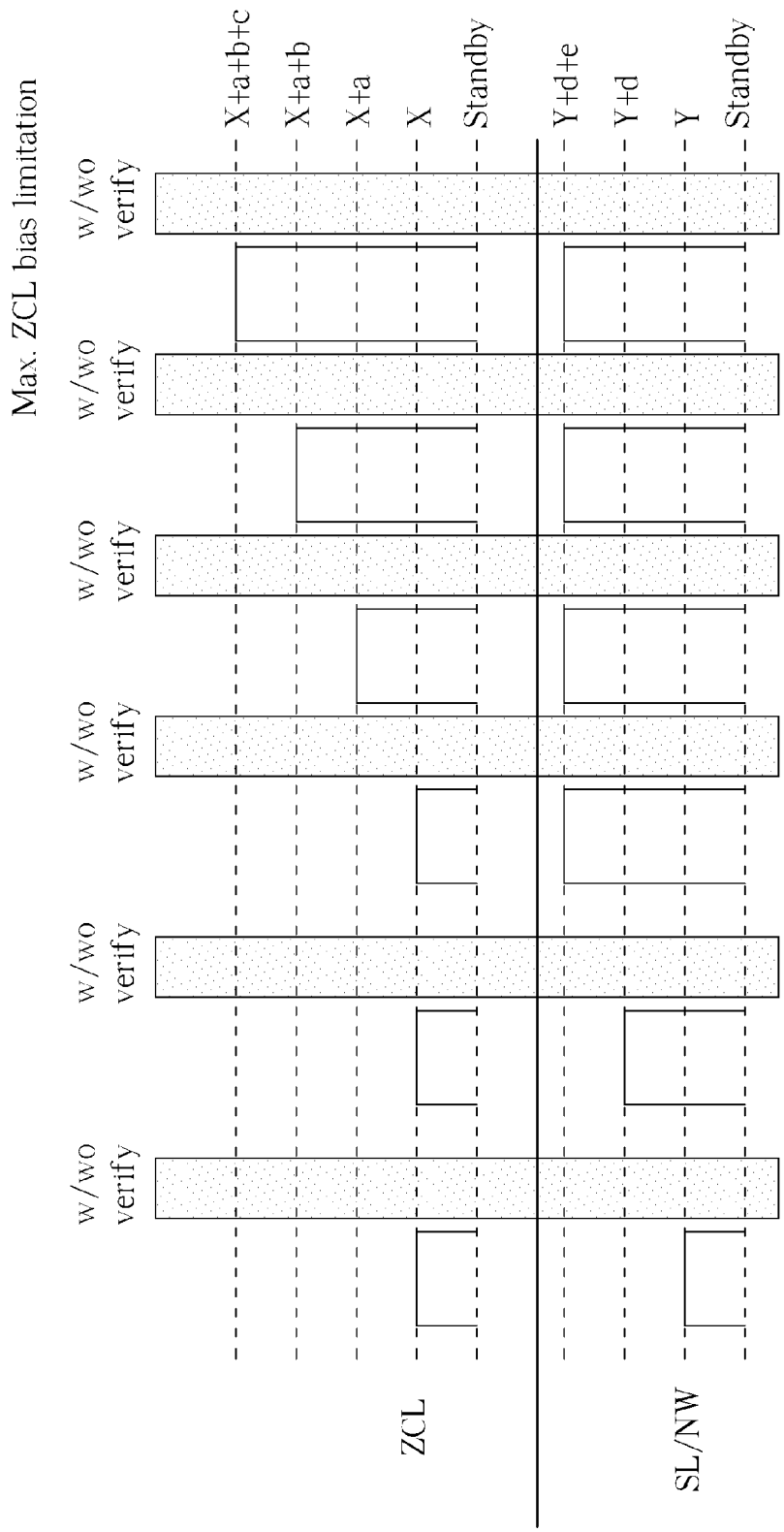
FIG. 16 is a diagram illustrating ramping gate voltage and source line/n-well voltages according to another embodiment.

Please refer to FIG. 16, which is a diagram illustrating ramping gate voltage ZCL and source line/n-well voltages SL/NW according to another embodiment. Initially, source line/n-well voltages SL/NW are stepped up from voltage Y to voltage Y+d, then to voltage Y+d+e. Verification may be performed following each step up in source line/n-well voltages. After reaching voltage Y+d+e, verification may be performed, then gate voltage ZCL may be stepped up from voltage X to voltage X+a, then to voltage X+a+b, then to voltage X+a+b+c, all while source line/n-well voltages SL/NW are at voltage Y+d+e. Verification may be performed after each step up in gate voltage ZCL.

Figure 17:
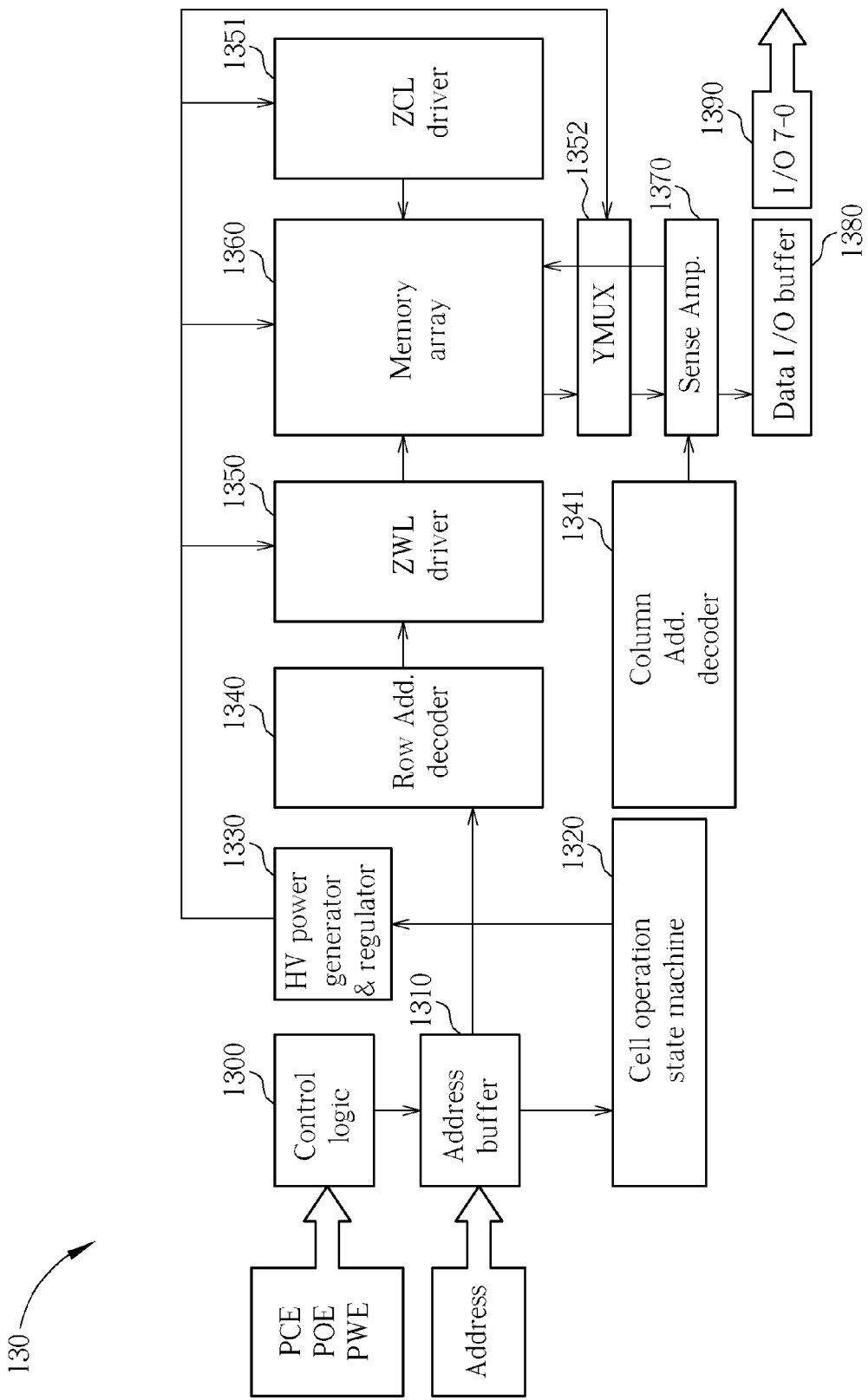
FIG. 17 is a diagram of a nonvolatile memory device for reducing programming current and improving reliability.

Please refer to FIG. 17, which is a diagram of a nonvolatile memory device 130 for reducing programming current and improving reliability. The nonvolatile memory device 130 comprises a memory cell array 1360, a word line driver 1350 and a control line driver 1351 coupled to the memory cell array 1360, a row address decoder 1340 coupled to the word line driver 1350, an address buffer 1310 coupled to the row address decoder 1340, a multiplexer 1352 coupled to the memory cell array 1360, a power generator 1330 coupled to the memory cell array 1360, the word line driver 1350, the control line driver 1351, and the multiplexer 1352, a sense amplifier 1370 coupled to the multiplexer 1352 and the memory cell array 1360, a column address decoder 1341 coupled to the sense amplifier 1370, a data I/O buffer 1380 coupled to the sense amplifier 1370, an I/O circuit 1390 coupled to the data I/O buffer 1390, and a cell operation state machine 1320 coupled to the address buffer 1310 and the power generator 1330. The memory cell array 1360 comprises memory cells, such as the memory cell 100 of FIG. 1, arranged at crossing points of a bit-line and word-line (or control line) matrix of the memory cell array 1360. The word line driver 1350, the control line driver 1351, the row address decoder 1340, and the column address decoder 1341 form a write circuit for providing multiple variable pulses or constant pulses to each control-line for programming during programming operation. The multiple variable pulses have predetermined amplitude for keeping gate injection current at a predetermined level during programming operation. The predetermined level may be roughly maximum while lowering conduction current. The multiplexer 1352, the sense amplifier 1370, the power generator 1330, and the cell operation state machine 1320 form a verification circuit for sensing variation of conduction current during the programming operation, and disabling the programming operation if the sensed conduction current during the programming operation reaches a predetermined value. The verification circuit may disable the programming operation when a predetermined programming time passes even if the sensed conduction current does not reach the predetermined value. The verification circuit may disable the programming operation when absolute value of the control-line voltage is greater than or equal to absolute value of threshold voltage. In the memory array 1360, each memory cell may be a p-channel memory cell comprising a charge storage layer. The charge storage layer may be an oxide-nitride-oxide (ONO) layer. The multiple variable pulses may further be provided to each bit-line (i.e. SL to BL bias) for programming. A multiple variable pulse pattern of the predetermined amplitude may be a step ramp or independent ramp pattern.

Figure 1:
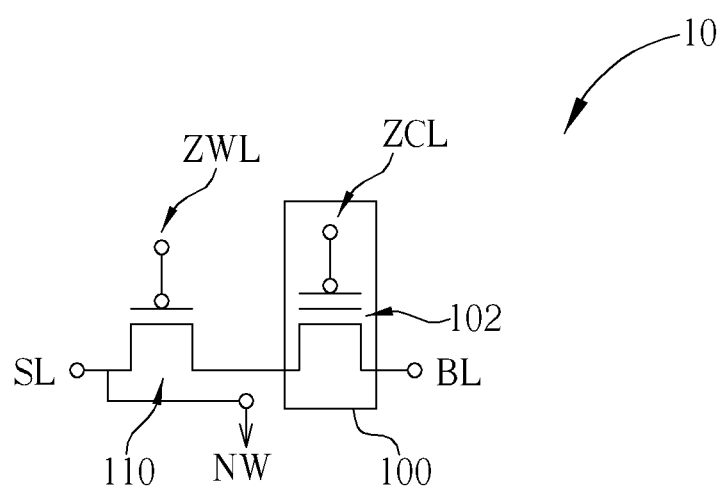
FIG. 1 is a diagram illustrating a memory cell according to the prior art.
Figure 2:
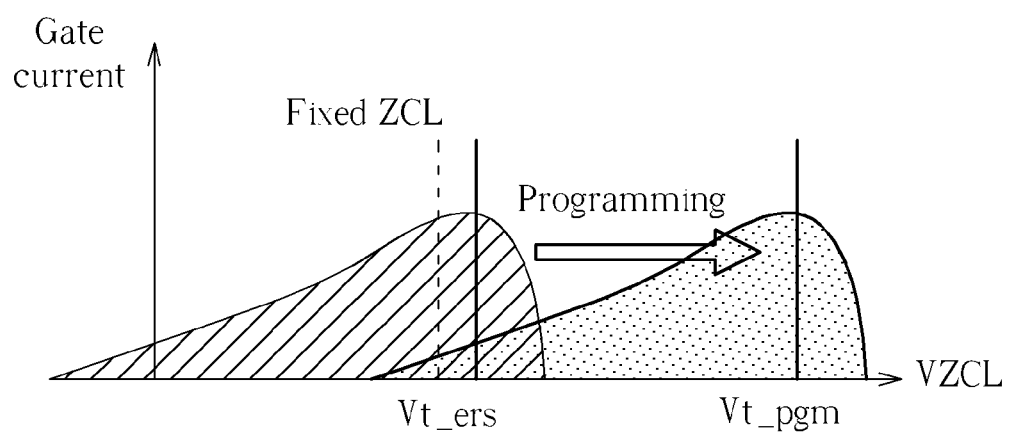
FIG. 2 is a diagram illustrating gate current versus gate voltage for a fixed control line voltage.
Figure 3:
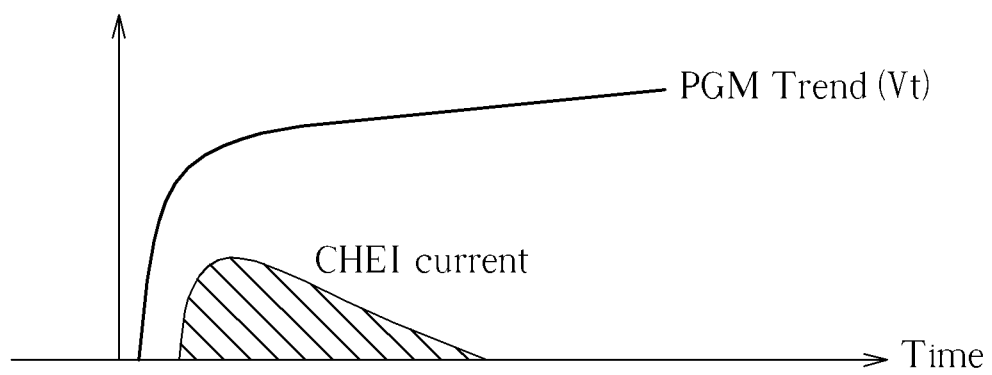
FIG. 3 is a diagram illustrating threshold voltage and CHEI current versus time for the fixed control line voltage.
Figure 18:
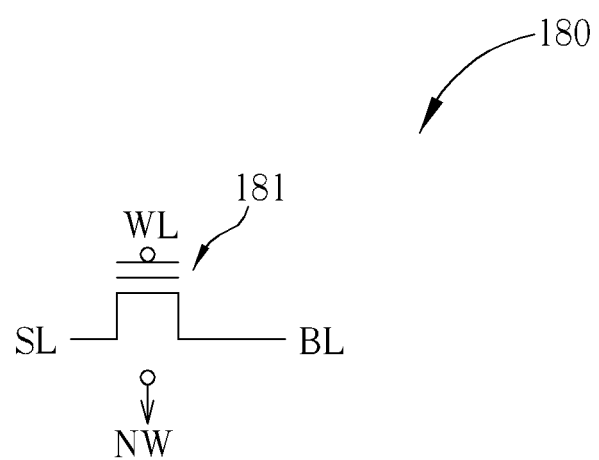
FIG. 18 is a diagram illustrating a double gate transistor according to an embodiment.

Please refer to FIG. 18, which is a diagram illustrating a double gate transistor 180 according to an embodiment. The memory cell can also be the double gate transistor 180 comprising the floating gate 181, and may also adopt ramping gate voltage to improve performance. In the above, for the memory cell 10 comprising the two transistors 100, 110, the control line voltage ZCL and/or the select line voltage SL may be ramped. For the double gate transistor 180, word line voltage WL applied to the gate of the double gate transistor 180, and bit line voltage BL applied to the drain of the double gate transistor 180 may be ramped. Ramping of the bit line voltage BL and/or the word line voltage WL shown in FIG. 18 may be accomplished in the same way described above for the control line voltage ZCL and the bit line voltage BL shown in FIG. 1. However, the respective memory cell architectures illustrated in FIG. 1 and FIG. 18 are different, such that connection of the word line voltage WL is different, and the double gate transistor 180 does not take a control line input. For the double gate transistor 180 shown in FIG. 18, for example, word line voltage WL may be ramped after the conduction current reaches a predetermined value and if the memory cell is in the slow corner, bit line voltage BL may also be ramped.

Please note that, although the above description is directed to p-type memory cells, an n-type memory cell may also adopt the same concept without departing from the teaching of the invention. Furthermore, the memory cell in FIG. 18 only represents one example. A single memory transistor containing a charge storage layer may also adopt the same concept without departing from the teaching of the invention.

From the above, it can be seen that ramping the control line voltage ZCL and/or the bit line voltage BL effectively reduces programming time, thereby increasing programming efficiency of the memory cell 10 shown in FIG. 1. Likewise, ramping the word line voltage WL and/or the bit line voltage BL effectively reduces programming time, thereby increasing programming efficiency of the double gate transistor 180 shown in FIG. 18.

In the above embodiments, ZCL ramping is used to optimize programming current and increase programming speed. However, if programming current is too high, circuit area must be increased to handle higher currents, which is undesirable from a circuit design perspective. For example, higher programming current increases pumping circuit area. Further, device corner variation requires higher program current prediction, and wastes circuit area. Finally, higher programming current also causes unnecessary damage to the memory cell, which may lead to poor programming efficiency after thousands of cycles. By selecting a slightly lower programming current, the circuit designer may avoid these issues while maintaining most of the speed and operation window advantages afforded by ZCL ramping. In the following description, a current limiting circuit is introduced into the memory cell architecture that acts to limit the programming current while retaining the various advantages described above. The current limiting circuit may clamp programming current directly, or may act to limit program current by affecting voltage drop between BL and SL, or the ZCL ramping voltage, according to sensed programming current.

Figure 19:
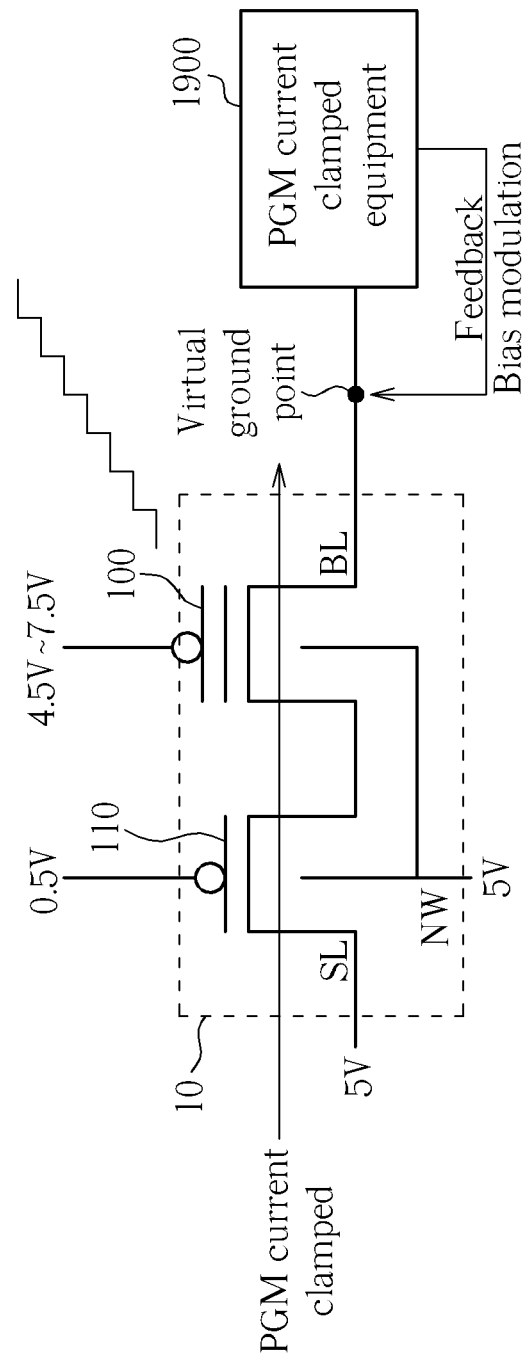
FIG. 19 is a diagram of the memory cell of FIG. 1 coupled to a program current limiting circuit.

Please refer to FIG. 19, which is a diagram of the memory cell 10 of FIG. 1 electrically connected to a program current limiting circuit 1900. In FIG. 19, the program current limiting circuit 1900 acts to control source-line-to-bit-line (SL-BL) bias by controlling voltage level of the bit line BL. As described above, the SL-BL bias may also be controlled by electrically connecting the program current limiting circuit 1900 to the source line SL instead of to the bit line BL. The program current limiting circuit 1900 is electrically connected to the bit line, and controls program current of the memory cell 10. As shown in FIG. 19, ZCL ramping (e.g. 4.5V-7.5V) is applied to the gate of the memory transistor 100 as described above. The select transistor 110 is biased by a low voltage, e.g. 0.5V, at its gate, and a select line voltage, e.g. 5V, at the select line input. The wells of the memory transistor 100 and select transistor 110 are both tied to a well voltage common to the SL, e.g. 5V. To limit the program current, the program current limiting circuit 1900 senses the program current, and uses feedback bias modulation to establish a virtual ground point at the bit line. Actual voltage at the bit line may change as Vt of the memory transistor 100 changes during programmed, as described above. In some embodiments, the program current limiting circuit 1900 may be electrically connected to the source line of the select transistor 110. In some embodiments, a program current limiting circuit such as the program current limiting circuit 1900 may be electrically connected at each of the current ends of the memory cell 10, i.e. at the bit line and the source line.

Figure 20:
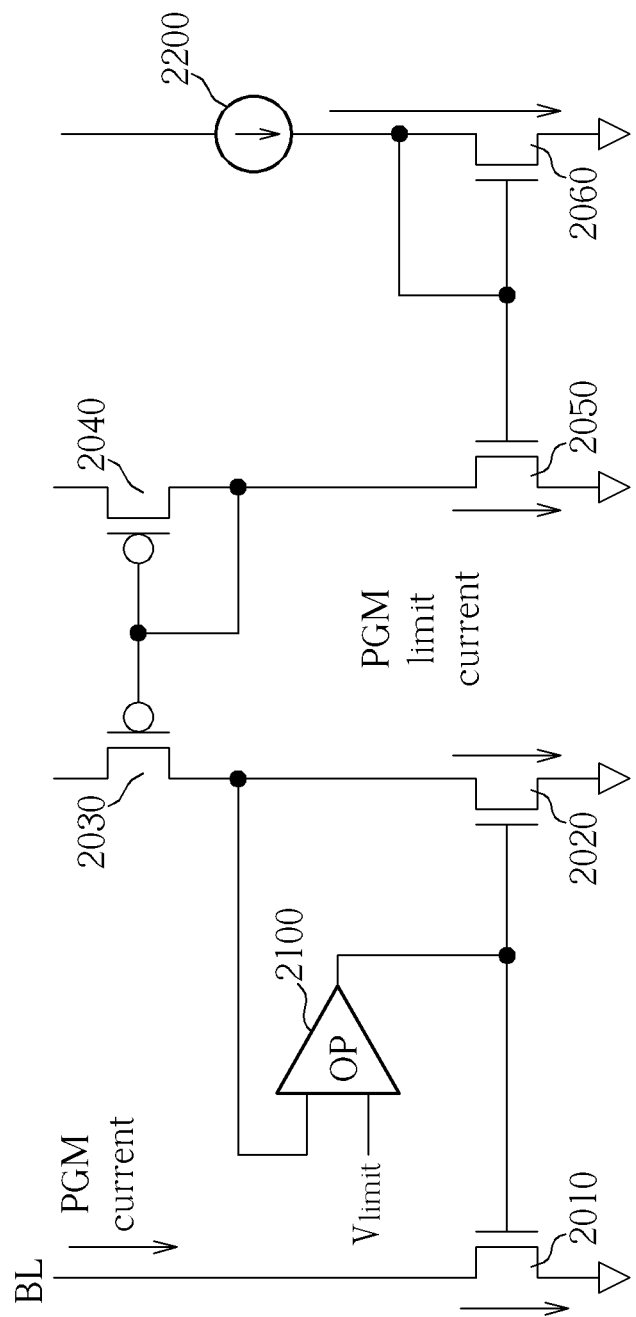
FIG. 20 is a diagram of one configuration of the program current limiting circuit of FIG. 19.

Many different program current limiting circuits are available as candidates for the program current limiting circuit 1900. Please refer to FIG. 20, which is a diagram of one configuration of the program current limiting circuit 1900 of FIG. 19. The program current limiting circuit 1900 shown in FIG. 20 is only one example. The program current limiting circuit 1900 comprises a first transistor 2010, a second transistor 2020, a third transistor 2030, a fourth transistor 2040, a fifth transistor 2050, and a sixth transistor 2060. The first transistor 2010 receives the program current through electrical connection to the bit line. As shown, drain electrodes of the second transistor 2020 and the third transistor 2030 are electrically connected to each other, and drain electrodes of the fourth transistor 2040 and the fifth transistor 2050 are electrically connected to each other. The sixth transistor 2060 is diode-connected (gate electrode directly coupled to drain electrode), and receives a reference current from a reference current source 2200 at its drain electrode, which sets a program limit current value. Gate electrodes of the first transistor 2010 and the second transistor 2020 are electrically connected to each other, gate electrodes of the third transistor 2030 and the fourth transistor 2040 are electrically connected to each other, and gate electrodes of the fifth transistor 2050 and the sixth transistor 2060 are electrically connected to each other. The fourth transistor 2040 is diode-connected. The gate of the second transistor 2020 is controlled by an operational amplifier 2100. The operational amplifier 2100 receives a limit voltage $V_{limit}$ at a first input terminal, and outputs a feedback signal to the gate electrode of the second transistor 2020 to maintain the limit voltage $V_{limit}$ at the drain electrodes of the second transistor 2020 and the third transistor 2030, thereby stabilizing the BL (drain of the first transistor 2010) while programming. The reference current source 2200 effectively limits the program current, which flows through the first transistor 2010.

Figure 21:
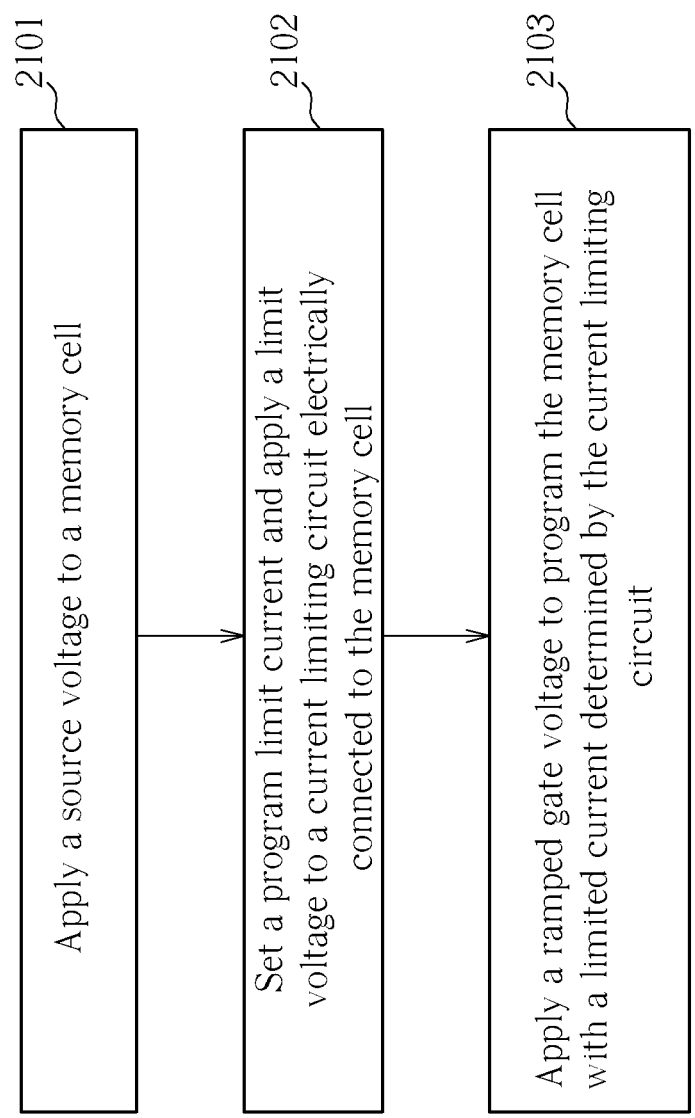
FIG. 21 is a flowchart of a method for programming a memory cell.

Please refer to FIG. 21, which is a flowchart of a method for programming a memory cell, such as the memory cell 10. The method comprises the following steps:

Step 2101: Apply a source voltage to the memory cell;

Step 2102: Set a program limit current, and apply a limit voltage to a current limiting circuit electrically connected to the memory cell; and Step 2103: Apply a ramped gate voltage to the memory cell to program the memory cell with a limited current determined by the current limiting circuit.

The source voltage is applied to the memory cell 10 at the source line SL (step 2101), which sets up a voltage drop from the source line SL to the bit line BL. The program limit current is set at the reference current source 2200 to clamp the program current of the memory cell 10. The limit voltage $V_{limit}$ is applied to the first input terminal of the operational amplifier 2100 (step 2102). To program the memory transistor 100, the ramped gate voltage (ZCL ramping) is applied to the gate of the memory transistor 100, and programming current of the memory cell 10 is limited by the current limiting circuit 1900 based on the program limit current and the limit voltage $V_{limit}$ (step 2103). In the current limiting circuit 1900 shown in FIG. 20, the programming current of the memory cell 10 is limited by the reference current set by the reference current source 2200 flowing through the sixth transistor 2060. In some embodiments, the source voltage in step 2101 may be replaced with the bit line voltage, assuming the current limiting circuit 1900 is electrically connected to the source line instead of to the bit line.

Thus, by limiting the program current while using the ZCL ramping to program the memory cell, pumping circuit area does not need to be increased, less circuit area is wasted for program current prediction, and less damage is done to the memory cell, while maintaining good operation window.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of programming a nonvolatile memory cell which comprises a select transistor and a memory transistor, the method comprising:
    applying a bias voltage to a first input of the memory cell;
    applying a preset limit current to a current limiting circuit electrically connected to a second input of the memory cell;
    applying a first ramped gate voltage to the memory cell to program the memory cell with a preset limited current determined by the current limiting circuit, the first ramped gate voltage climbing to a first voltage;
    performing a verification process on the memory cell; and
    when the verification process on the memory cell fails, applying a second ramped gate voltage to the memory cell to program the memory cell with the preset limited current determined by the current limiting circuit, the second ramped gate voltage being higher than the first voltage.

2. The method of claim 1, wherein the first input is the source line, and the second input is the bit line.

3. The method of claim 1, wherein the first input is the bit line, and the second input is the source line.

4. The method of claim 1, wherein applying the first or the second ramped gate voltage to the memory cell to program the memory cell with the preset limited current determined by the current limiting circuit comprises:
    controlling source-line-to-bit-line bias of the memory cell by feedback of the current limiting circuit to the bit line and stabilization by the preset limit current.

5. The method of claim 1, wherein applying the first or the second ramped gate voltage to the memory cell to program the memory cell with the preset limited current determined by the current limiting circuit comprises:
    controlling source-line-to-bit-line bias of the memory cell by feedback of the current limiting circuit to the source line and stabilization by the preset limit current.

6. A nonvolatile memory device comprising:
    a select transistor having a first terminal, a second terminal and a gate terminal;
    a memory transistor having a third terminal coupled to the second terminal of the select transistor, a fourth terminal and a control terminal configured to receive a first ramped gate voltage for inducing a program current to program the memory transistor, a verification voltage for verifying programming of the memory cell, and when verification fails, a second ramped gate voltage higher than the first ramped gate voltage for inducing the program current to program the memory transistor; and
    a current limiting circuit for controlling a voltage drop across the first terminal of the select transistor and the fourth terminal of the memory transistor for limiting the program current.

7. The nonvolatile memory device of claim 6, wherein the current limiting circuit is electrically connected to the first terminal of the select transistor.

8. The nonvolatile memory device of claim 6, wherein the current limiting circuit is electrically connected to the fourth terminal of the memory transistor.

9. The nonvolatile memory device of claim 6, wherein the current limiting circuit comprises an input terminal for sensing the program current, and an output terminal for controlling the voltage drop according to the sensed program current.

10. The nonvolatile memory device of claim 9, wherein the output terminal of the current limiting circuit is electrically connected to the fourth terminal of the memory transistor.

11. The nonvolatile memory device of claim 9, wherein the output terminal of the current limiting circuit is electrically connected to the first terminal of the select transistor.

* * * * *